United States Patent
Lin et al.

(10) Patent No.: US 6,534,388 B1
(45) Date of Patent: Mar. 18, 2003

(54) METHOD TO REDUCE VARIATION IN LDD SERIES RESISTANCE

(75) Inventors: Wenhe Lin, Singapore (SG); Zhong Dong, Singapore (SG); Simon Chooi, Singapore (SG); Kin Leong Pey, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 111 days.

(21) Appl. No.: 09/670,330

(22) Filed: Sep. 27, 2000

(51) Int. Cl.[7] .............................................. H01L 21/04
(52) U.S. Cl. ..................... 438/510; 438/522; 438/439; 438/448; 438/452; 438/769; 438/775; 438/786; 257/408; 257/410; 257/411; 257/336
(58) Field of Search .............................. 438/510–514, 438/522, 680–81, 261–5, 287, 439–52, 769–91; 257/408–11, 336

(56) References Cited

U.S. PATENT DOCUMENTS

| 5,629,221 | A | | 5/1997 | Chao et al. ................ 438/491 |
| 5,648,287 | A | * | 7/1997 | Tsai et al. ................... 437/44 |
| 5,693,550 | A | * | 12/1997 | Torii ............................ 437/41 |
| 5,811,343 | A | | 9/1998 | Wann et al. ................ 438/305 |
| 5,976,991 | A | * | 11/1999 | Laxman et al. ............. 438/786 |
| 6,144,071 | A | | 1/2000 | Gardner et al. ............. 257/344 |
| 6,037,639 | A | * | 3/2000 | Ahmad ........................ 257/401 |
| 6,069,398 | A | * | 5/2000 | Kadosh et al. .............. 257/538 |
| 6,103,580 | A | * | 8/2000 | Guo ............................. 438/291 |
| 6,136,636 | A | * | 10/2000 | Wu .............................. 438/231 |
| 6,207,538 | B1 | * | 3/2001 | Pan et al. .................... 438/510 |
| 6,245,689 | B1 | * | 6/2001 | Hao et al. .................... 438/769 |
| 6,303,479 | B1 | * | 10/2001 | Snyder ........................ 438/581 |
| 6,323,094 | B1 | * | 11/2001 | Wu .............................. 438/303 |
| 6,323,519 | B1 | * | 11/2001 | Gardner et al. ............. 257/336 |
| 2002/0004294 | A1 | * | 1/2002 | Gardner et al. ............. 438/585 |

OTHER PUBLICATIONS

Wu et al. "High–performance polysilicon contacted shallow junctions formed by stacked amorphous silicon films" IEEE electron device letters vol. 13 No. 1 1/92 p. 23–25.*

Krooshof et al. "Study of the rapid thermal nitridation and silicidation of Ti using elastic recoil detection /Ti on Sio2" Journ. of App. Phys. vol. 63 No. 10 May 15, 1988 p. 5110–14.*

* cited by examiner

Primary Examiner—Matthew Smith
Assistant Examiner—Granvill D Lee, Jr.
(74) Attorney, Agent, or Firm—George O. Saile; Rosemary L. S. Pike

(57) ABSTRACT

A process used to retard out diffusion of P type dopants from P type LDD regions, resulting in unwanted LDD series resistance increases, has been developed. The process features the formation of a nitrogen containing layer, placed between the P type LDD region and overlying silicon oxide regions, retarding the diffusion of boron from the LDD regions to the overlying silicon oxide regions, during subsequent high temperature anneals. The nitrogen containing layer, such as a thin silicon nitride layer, or a silicon oxynitride layer, formed during or after reoxidation of a P type polysilicon gate structure, is also formed in a region that also retards the out diffusion of P type dopants from the P type polysilicon gate structure.

10 Claims, 4 Drawing Sheets

METHOD TO REDUCE VARIATION IN LDD SERIES RESISTANCE

BACKGROUND OF THE INVENTION (1) Field of Invention

The present invention relates to methods used to fabricate semiconductor devices and more specifically to methods used to control the series resistance of lightly doped source and drain, (LDD), regions.

(2) Description of Prior Art

Metal oxide semiconductor field effect transistor, (MOSFET), devices can be fabricated as N channel, or P channel devices. The P channel, or PMOS devices feature P type, LDD regions as well as P type doped, polysilicon gate structures. These P type regions, comprised with boron ions, can however experience decreased boron concentration during thermal cycles encountered during subsequent processing sequences. The affinity of boron for silicon oxide, can result in boron, located in the polysilicon gate structure, or in the LDD region, diffusing from these regions to adjacent silicon oxide regions, such as pad oxides on the LDD region or silicon oxide spacers on the polysilicon gate structures, during subsequent anneal cycles.

The present invention will describe several solutions for reducing the diffusion of boron from both P type polysilicon gate structures, as well as from P type, LDD regions, into adjacent silicon oxide regions, thus reducing the risk of increased LDD resistance, which can result from the unwanted boron diffusion phenomena. Prior art, such as Chao et al, in U.S. Pat. No. 5,629,221, offer a process of implanting nitrogen, through a polysilicon layer, to form a barrier layer to prevent boron out diffusion, at a gate insulator interface. The present invention will offer solutions to the boron diffusion phenomena which however will not involve the gate oxide layer, thus not risk compromising gate oxide integrity.

SUMMARY OF THE INVENTION

It is an object of this invention to retard boron out diffusion from a P type polysilicon gate structure, and from P type, LDD regions, via formation of a monolayer of silicon nitride at the interface of the LDD or polysilicon gate-silicon oxide interface, accomplished via a plasma nitridation procedure performed after a polysilicon reoxidation procedure.

It is another object of this invention to retard boron out diffusion from a P type polysilicon gate structure, and from P type, LDD regions, via formation of a silicon oxynitride formed on the surface of the P type, polysilicon gate structure, and on the surface of the P type LDD regions, via introduction of a nitrogen source during the polysilicon reoxidation procedure.

It is yet another object of this invention to retard boron out diffusion from a P type polysilicon gate structure, and from P type, LDD regions, via deposition of a thin silicon nitride layer on the surface of the oxide formed after the polysilicon reoxidation procedure.

In accordance with the present invention methods used to form a nitrogen containing layer, used to retard diffusion of boron from P type polysilicon gate structures, and from P type, LDD regions, into adjacent silicon oxide layers, are described. A first method features a polysilicon reoxidation procedure resulting in the formation of a silicon oxide layer on the surfaces of a P type polysilicon gate structure, and on the surface of P type, LDD regions. An RF plasma treatment is then performed using a nitrogen source, to form a silicon nitride monolayer at the interface of the silicon oxide-polysilicon gate, or LDD region. A second method used to retard boron diffusion from the P type elements is the addition of a nitrogen, to the ambient used for the polysilicon reoxidation procedure, resulting in a silicon oxynitride layer, on the surfaces of the P type polysilicon gate structure and on the surfaces of the P type LDD regions. A third method used to retard boron out diffusion is the chemical vapor deposition of a thin silicon nitride layer on the surface of a polysilicon oxide layer, formed on the exposed surfaces of the P type polysilicon gate structure, and the P type LDD regions. An overlying silicon oxide layer is then formed via chemical vapor deposition procedures, using tetraethylorthosilicate, (TEOS), as a source, followed by the formation of an overlying thick silicon nitride insulator spacer. Heavily doped, P type source/drain regions are then defined via ion implantation procedures, using the thick insulator spacer as a mask.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
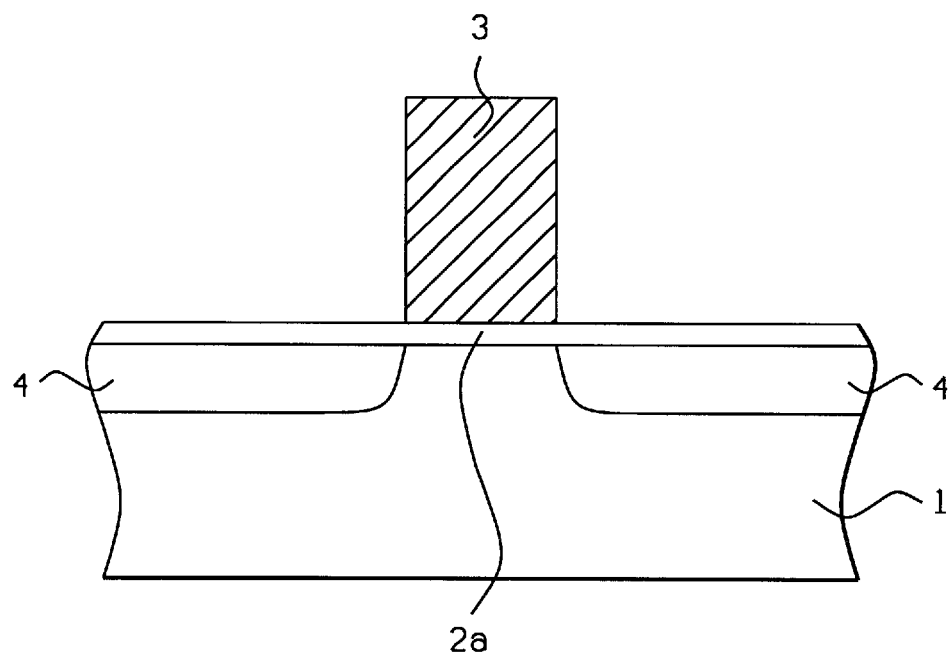
FIGS. 1–8, which schematically, in cross-sectional style, describe key stages of fabrication used to form a nitrogen containing layer, used to retard the out diffusion of boron from a P type polysilicon gate structure, and from P type LDD regions.

Methods of forming a nitrogen containing layer, to be used to retard the diffusion of boron from P type polysilicon gate structures, and from P type LDD regions, into adjacent silicon oxide regions, will now be described in detail. FIG. 1, schematically, in cross-sectional style, shows a PMOS device, after formation of a P type LDD region. A P type, semiconductor substrate 1, comprised of single crystalline silicon, with a <100> crystallographic orientation is used. An N well region, not shown in the drawings, is formed in areas of P type semiconductor substrate 1, to be used for PMOS devices. The N well region is formed, via implantation of arsenic or phosphorous ions. Regions of P type semiconductor substrate 1, to be used for N channel, or NMOS devices, do not experience the N type, ion implantation procedure. Gate insulator layer 2a, comprised of silicon dioxide, is thermally grown, in an oxygen-steam ambient, to a thickness between about 15 to 80 Angstroms. A polysilicon layer is next deposited via low pressure chemical vapor deposition, (LPCVD), procedures, to a thickness between about 1500 to 3000 Angstroms. The polysilicon layer can be doped insitu, during deposition, via the addition of diborane to a silane ambient, or the polysilicon layer can be deposited intrinsically then doped via implantation of boron or $BF_2$ ions. Conventional photolithographic and anisotropic reactive ion etching, (RIE), procedures, using $Cl_2$ or $SF_6$ as an etchant, are used to define P type, polysilicon gate structure 3, shown schematically in FIG. 1. Removal of the photoresist shape used to define P type, polysilicon gate structure 3, is accomplished via plasma oxygen ashing and careful wet cleans. P type LDD region 4, is next formed in regions of P type semiconductor substrate 1, not covered by P type polysilicon gate structure 3, via implantation of boron, or $BF_2$ ions, at an energy between about 1 to 50 KeV, at a dose between about 5E12 to 8E14 atoms/$cm^2$.

Figure 2:
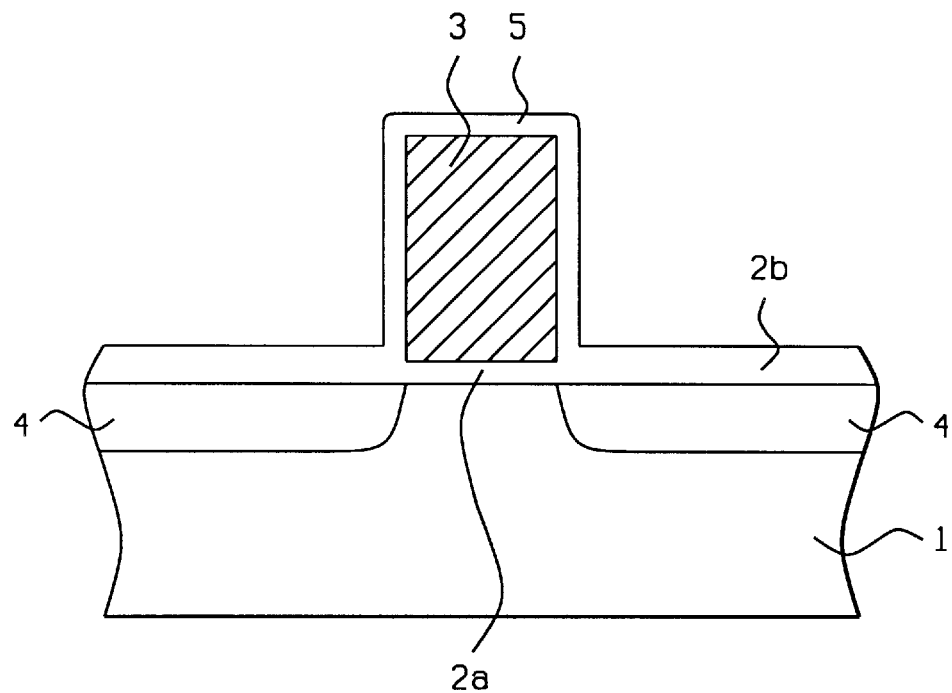

Reoxidation of P type polysilicon gate structure 3, is next addressed and schematically shown in FIG. 2. Silicon oxide layer 5, at a thickness between about 30 to 60 Angstroms, is thermally grown on the exposed surfaces of P type, polysilicon gate structure 3, at a temperature between about 700 to 1000° C. The polysilicon reoxidation procedure also results in additional growth of the regions of gate insulator layer 2a, not covered by P type gate structure 3, resulting in gate insulator 2b, now at a thickness between about 40 to 100 Angstroms.

Figure 3:
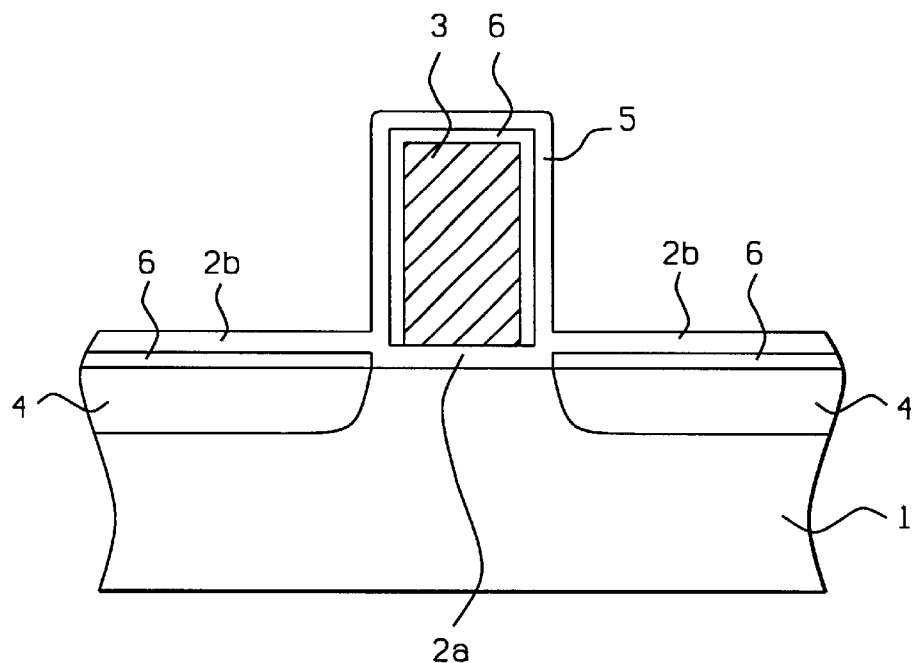

A first method used to retard out diffusion of boron, from P type polysilicon gate structure 3, and from P type LDD region 4, during subsequent processing steps, is the creation of nitrogen containing layer 6, formed at the interface of silicon oxide layer 5, and P type polysilicon gate structure 3, and at the interface of gate insulator layer 2b, and P type LDD region 4. A monolayer of nitrogen containing layer 6, at a thickness between about 3 to 5 Angstroms, is formed via a remote plasma nitridation procedure, performed at an RF power between about 5 to 300 W, at a substrate temperature between about 150 to 500° C., at a pressure between about 50 mtorr to 100 Torr, in a helium-argon ambient, with the addition of a nitrogen containing source such as $N_2O$, $N_2$, $NH_3$, or NO, and with the ratio of helium-argon to the nitrogen containing gas of about 10,000 to 1. The result of this procedure is schematically shown in FIG. 3.

Figure 4:
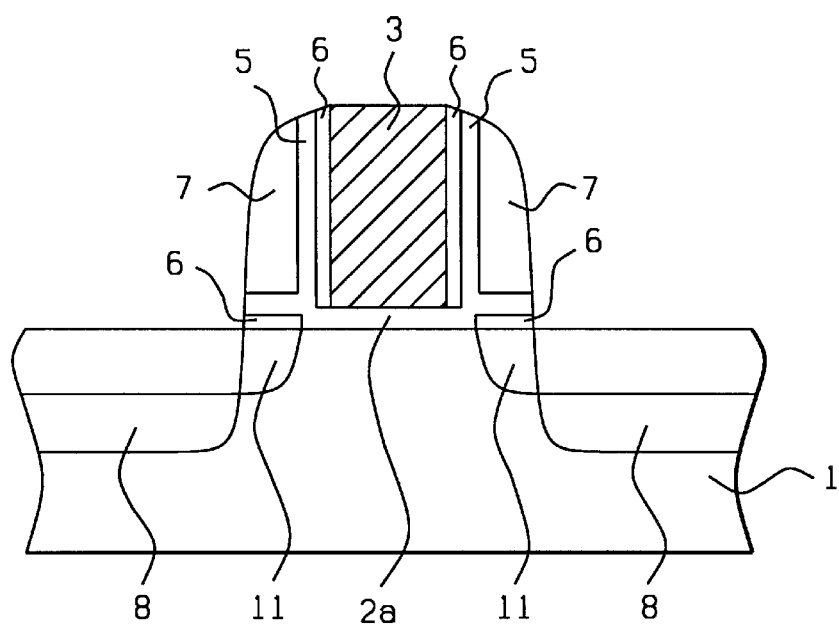

The fabrication of the PMOS device, featuring nitrogen containing layer 6, is continued with the formation of insulator spacers 7, and the formation of heavily doped, P type source/drain regions 8. Deposition of a silicon oxide layer, using tetraethylorthosilicate, (TEOS), as a source, is next accomplished via LPCVD or plasma enhanced chemical vapor deposition, (PECVD), procedures, to a thickness between about 600 to 1400 Angstroms. An aisotropic RIE procedures, using $CHF_3$ or $CF_4$ as an etchant, is next employed to define insulator spacers 7. If desired a composite insulator spacer, comprised of an underlying layer of silicon oxide, and overlying silicon nitride layer, can be used. This is accomplished via deposition of an underlying silicon oxide layer, using LPCVD or PECVD procedures, at a thickness between about 100 to 200 Angstroms, and using TEOS as a source, followed by the deposition of an overlying layer of silicon nitride, also obtained via LPCVD or PECVD procedures, at a thickness between about 600 to 1200 Angstroms. Anisotropic RIE procedures, again using $CHF_3$ or $CF_4$ as an etchant, are used to create the composite insulator spacer. Heavily doped, P type source/drain region 8, is next defined in regions of semiconductor substrate 1, not covered by P type polysilicon gate structure 3, or by insulator spacers 7, via implantation of boron or $BF_2$ ions, at an energy between about 1 to 50 KeV, at a dose between about 5E12 to 8E14 atoms/cm$^2$. The result of these procedures is schematically shown in FIG. 4. Subsequent anneal cycles, used to activate the dopants in the source/drain regions, or to form metal silicide regions, will not result in out diffusion of boron from P type polysilicon gate structure 3, or from P type LDD region 4, as a result of the diffusion barrier characteristics of nitrogen containing layer 6. This reduces the variation in the series resistance of the P type LDD element.

Figure 5:
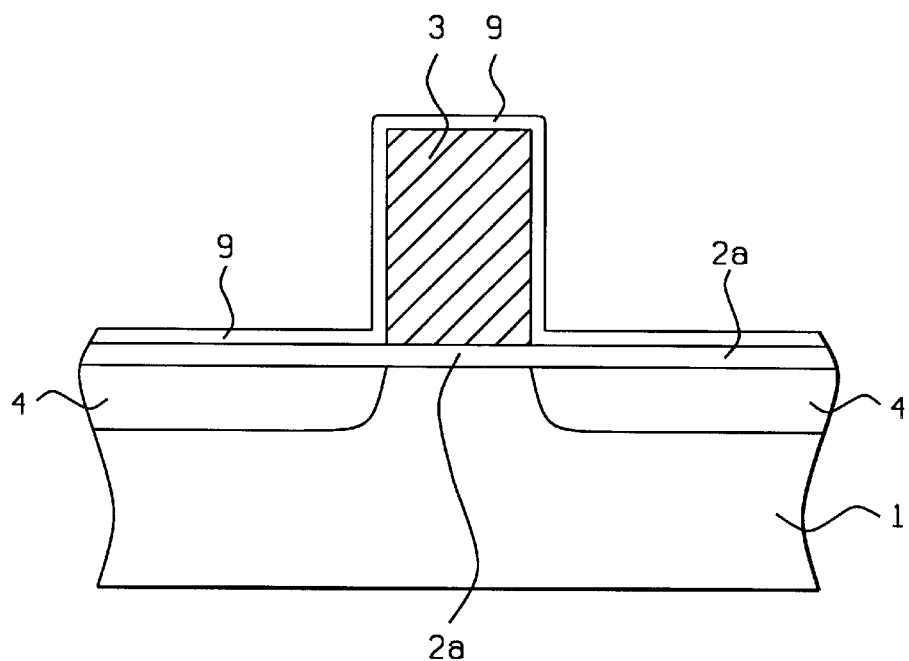

A second method of creating a nitrogen containing layer, used to retard boron out diffusion from a P type polysilicon gate structure and from P type LDD regions, is next described and schematically shown in FIG. 5. After definition of P type polysilicon gate structure 3, introduction of a nitrogen containing gas, such as $N_2O$ or NO, to an oxidizing ambient used for the polysilicon reoxidation procedure, is employed to create nitrogen containing, silicon oxynitride layer 9, formed at the surface of P type polysilicon gate structure 3, and P type LDD region 4, This procedure can be accomplished using a nitrogen containing gas such as NO or $N_2O$, or mixture of oxygen and nitrogen containing sources, such as $NH_3+O_2$, $N_2+O_2$, $NO+O_2$, and $N_2O+O_2$. Silicon oxynitride layer 9, is formed at a thickness between about 40 to 100 Angstroms, using either conventional furnace or rapid thermal processing (RTP), procedures, at a temperature between about 700 to 1200° C., at a pressure between about 0.01 to 200 torr, using a flow of about 0.1 to 40 standard liters per min for the oxidizing-nitriding source. Silicon oxynitride layer 9, can also be formed via plasma procedures using an RF power between about 5 to 300 W, a substrate temperature between about 150 to 500° C., at a pressure between about 50 mtorr to 100 torr, and using a ratio of helium-argon to the nitrogen containing source, of about 10,000 to 1. The nitrogen containing sources for the plasma procedure are the same nitrogen and oxygen sources used for the furnace or RTP procedures.

Figure 6:
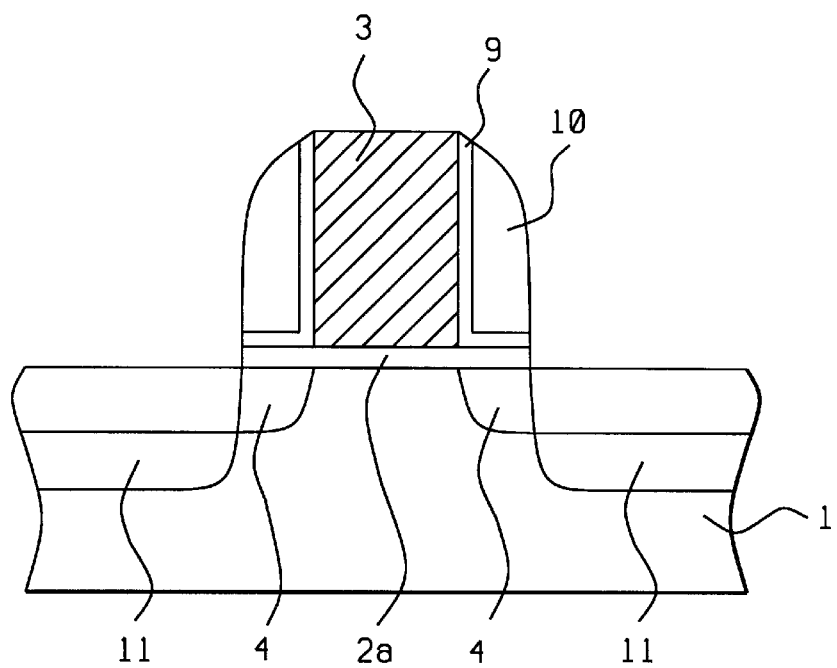

FIG. 6, schematically shows the formation of insulator spacers 10, formed identically to insulator spacers 7, previously shown, and the formation of heavily doped, P type source/drain region 11, again formed identically to previously described heavily doped, source/drain region 8. Nitrogen containing, silicon oxynitride layer 9, will again retard the diffusion of boron from P type polysilicon gate structure 3, and from P type LDD region 4, to adjacent silicon oxide regions such as insulator spacers 10, during subsequent hot process procedures.

Figure 7:
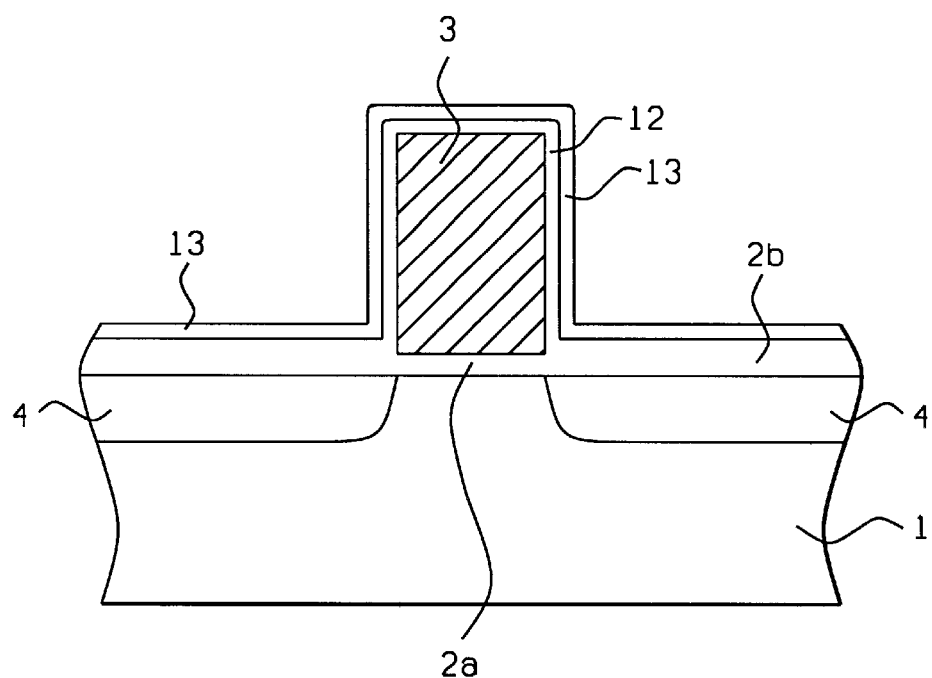
Figure 8:
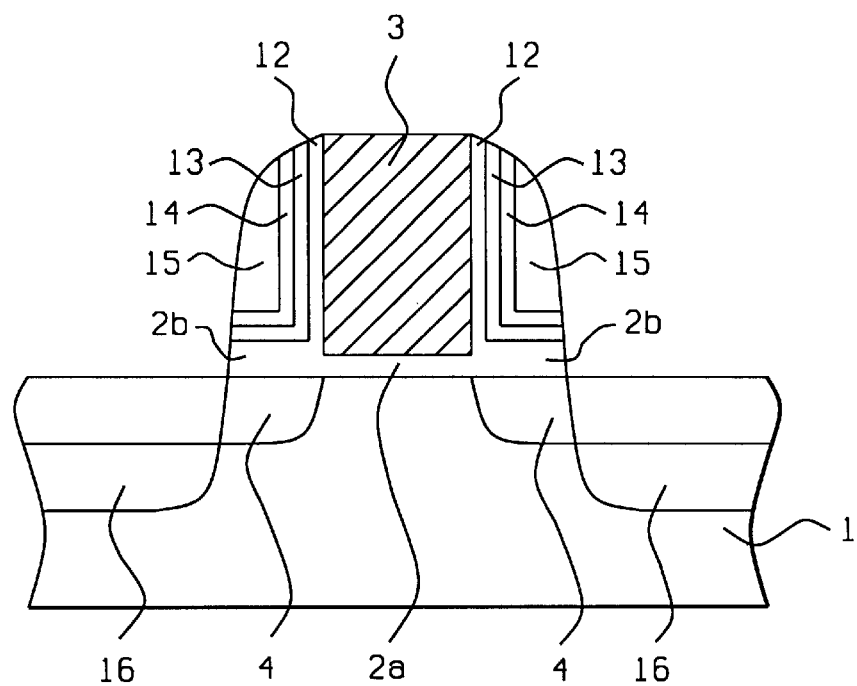

A third method used to create a nitrogen containing layer, used to retard the diffusion of boron from P type polysilicon gate structure 3, and from P type LDD region 4, is next described and schematically shown in FIGS. 7–8. After definition of P type polysilicon gate structure 3, a polysilicon reoxidation procedure, identical to the procedure previously used to form silicon oxide layer 5, is again employed to form silicon oxide layer 12, again at a thickness between about 30 to 60 Angstroms, on the surfaces of P type polysilicon gate structure 3. Regions of gate insulator layer 2a, exposed to the polysilicon reoxidation procedure, now result in an increased thickness, between about 40 to 100 Angstroms. A thin silicon nitride layer 13, is next deposited at a thickness between about 6 to 20 Angstroms, using either LPCVD, rapid thermal chemical vapor deposition, (RTCVD), or remote plasma enhanced chemical vapor deposition, (RPECVD), procedures. Process conditions for the LPCVD or RTCVD procedures are a temperature between about 700 to 1200° C., a pressure between about 0.01 to 100 torr using $SiH_4$ and $NH_3$, or $SiH_4$ and $N_2$ as reactants. Process conditions for the RPECVD procedure are an RF power between about 5 to 300 W, a substrate temperature between about 150 to 500° C., a pressure between about 50 mtorr to 100 torr, and using $SiH_4$ and $NH_3$ or $N_2$ as reactants, in a main carrier gas mixture of helium and argon. The result of the silicon nitride deposition is schematically shown in FIG. 7.

A composite insulator spacer, comprised of underlying silicon oxide component 14, and overlying silicon nitride component 15, is next formed. This is accomplished via LPCVD or PECVD deposition of a silicon oxide layer, at a thickness between about 100 to 200 Angstroms, followed by another PECVD or LPCVD procedure used to deposit an overlying silicon nitride layer, at a thickness between about 600 to 1200 Angstroms. An anisotropic RIE procedures, using $CHF_3$ or $CF_4$ as an etchant, is used to define the composite insulator spacer. If desired the composite insulator spacer can be replaced by either a silicon oxide only, or a silicon nitride only spacer. Heavily doped, P type source/drain region 16, is again formed via ion implantation of boron or $BF_2$ ions, using conditions identical to those previously described for the heavily doped, P type source/drain regions. The result of these procedures are schematically shown in FIG. 8. The attainment of nitrogen containing, silicon nitride layer 13, will prevent boron from diffusing from P type polysilicon gate structure 3, and from P type LDD region 4, into the composite insulator spacer, thus eliminating increases in LDD series resistance.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a P channel, metal oxide semiconductor, (PMOS), device, on a semiconductor substrate, featuring the use of a monolayer of silicon nitride, used to retard out diffusion of P type dopants from a P type polysilicon gate structure, and from a P type lightly doped source/drain, (LDD), region, comprising the steps of:

forming said P type polysilicon gate structure on an underlying first gate insulator layer;

forming said P type LDD region, in a region of said semiconductor substrate not covered by said P type polysilicon gate structure;

performing an oxidation procedure to create a polysilicon oxide layer on the surface of said P type polysilicon gate structure, and forming a second gate insulator layer, on the surface of said P type LDD region, with said second gate insulator layer greater in thickness than said first gate insulator layer;

performing a plasma nitridation procedure to create said monolayer of silicon nitride, at a thickness between about 3 to 5 Angstroms, on the surface of said P type polysilicon gate structure, underlying said polysilicon oxide layer, and creating said monolayer of silicon nitride on the surface of said P type LDD region, underlying said second gate insulator layer;

forming insulator spacers on the sides of said polysilicon oxide layer, located on the sides of said P type polysilicon gate structures; and forming a heavily doped, P type source/drain region, in an area of said semiconductor substrate not covered by said P type polysilicon gate structure or by said insulator spacers.

2. The method of claim 1, wherein said first gate insulator layer is a silicon dioxide layer obtained via thermal oxidation procedures at a thickness between about 15 to 80 Angstroms.

3. The method of claim 1, wherein said P type polysilicon gate structure is formed from a polysilicon layer, obtained via LPCVD procedures to a thickness between about 1500 to 3000 Angstroms, either doped in situ, during deposition, via the addition of diborane to a silane source, or deposited intrinsically then doped via ion implantation of boron or $BF_2$ ions.

4. The method of claim 1, wherein said P type LDD region is formed via implantation of boron or $BF_2$ ions, at an energy between about 1 to 50 KeV, at a dose between about 5E12 to 8E14 atoms/cm$^2$.

5. The method of claim 1, wherein said polysilicon oxide layer, formed on the surfaces of said P type polysilicon gate structure is obtained via thermal oxidation procedures, at a temperature between about 700 to 1000° C., to a thickness between about 30 to 60 Angstroms.

6. The method of claim 1, wherein said second gate insulator layer is a silicon dioxide layer, at a thickness between about 40 to 100 Angstroms.

7. The method of claim 1, wherein said monolayer of silicon nitride at a thickness between about 3 to 5 Angstroms, via a remote plasma nitridation procedure, performed at an RF power between about 5 to 300 W, at a substrate temperature between about 150 to 500° C., at a pressure between about 50 mtorr to 100 torr, in a helium-argon ambient, with the addition of a nitrogen containing source such as $N_2O$, $N_2$, $NH_3$, or NO, with the ratio of helium-argon to the nitrogen containing gas of about 10,000 to 1.

8. The method of claim 1, wherein said insulator spacers are comprised of silicon oxide, formed from a silicon oxide layer obtained via LPCVD or PECVD procedures, using tetraethylorthosilicate, (TEOS), as a source, to a thickness between about 600 to 1400 Angstroms, and defined via an anisotropic RIE procedures, using $CHF_3$ or $CF_4$ as an etchant.

9. The method of claim 1, wherein said insulator spacers are composite insulator spacers comprised of a underlying silicon oxide component, at a thickness between about 100 to 200 Angstroms, and an overlying silicon nitride component, at a thickness between about 600 to 1200 Angstroms.

10. The method of claim 1, wherein said heavily doped, P type source/drain region is formed via implantation of boron or $BF_2$ ions, at an energy between about 1 to 50 KeV, at a dose between about 5E12 to 8E14 atoms/cm$^2$.

* * * * *